United States Patent
Kaneko et al.

(10) Patent No.: US 7,704,861 B2
(45) Date of Patent: Apr. 27, 2010

(54) ELECTRON BEAM MICROPROCESSING METHOD

(75) Inventors: Tadaaki Kaneko, Sanda (JP); Kiyoshi Sakaue, Takarazuka (JP); Naokatsu Sano, Sanda (JP)

(73) Assignee: Riber SA, Rueil-Malmaison (FR)

( * ) Notice: Subject to any disclaimer, the term of this patent is extended or adjusted under 35 U.S.C. 154(b) by 791 days.

(21) Appl. No.: 10/558,194

(22) PCT Filed: May 25, 2004

(86) PCT No.: PCT/JP2004/007452
§ 371 (c)(1),
(2), (4) Date: Oct. 26, 2006

(87) PCT Pub. No.: WO2004/105111
PCT Pub. Date: Dec. 2, 2004

(65) Prior Publication Data
US 2007/0099334 A1    May 3, 2007

(30) Foreign Application Priority Data
May 26, 2003    (JP)    ............ 2003-147189

(51) Int. Cl.
*H01L 21/36*    (2006.01)

(52) U.S. Cl. ............... 438/487; 257/E21.134
(58) Field of Classification Search ............ 438/172, 438/487; 257/E21.134
See application file for complete search history.

(56) References Cited

U.S. PATENT DOCUMENTS
5,451,548 A * 9/1995 Hunt et al. ............ 427/596

FOREIGN PATENT DOCUMENTS

| JP | 05-74746 | 3/1993 |
| JP | 05-175173 | 7/1993 |
| JP | 07-211704 | 8/1995 |
| JP | 8-321483 | 12/1996 |
| JP | 2001-267213 | 9/2001 |

OTHER PUBLICATIONS

Kaneko, Tadaaki, "Sonoba", Maskless Nanolithography, Denshi Zairyo, Jan. 2002, vol. 41, No. 1, pp. 50-55 (Translation).*
Kaneko,Tadaaki, "Sonoba", Maskless Nanolithography, Denshi Zairyo, vol. 41, No. 1, pp. 50 to 55, 2002.
Hoyle, P.C. et al., "Fabrication of free-standing microtransducers in GaAs with an electron-beam-induced oxide mask and $Cl_2$ etching", Sensors and Actuators A , vol. 50, pp. 31 to 37, 1995.
Uehara, Jun'ichi et al, "Denshisen Chokusetsu Byogaho o Mochiita GaAs Kibanjo eno Maskless Nano-lithography", Dai 51 Kai Oyo Butsurigaku Kankei Rengo Koenkai Koen Yokoshu, vol. 51, No. 3, p. 1561 29p-E-8, 2004.

* cited by examiner

*Primary Examiner*—W. David Coleman
*Assistant Examiner*—Christine Enad
(74) *Attorney, Agent, or Firm*—Oblon, Spivak, McClelland, Maier & Neustadt, L.L.P.

(57) ABSTRACT

Onto a surface of an $Al_xGa_yIn_{1-x-y}As_zP_{1-z}$ ($0\leq x, y, z \leq 1$) layer including GaAs alone or an InP substrate, an electron beam controlled to an arbitrary electron beam diameter and current density is irradiated so as to selectively substitute or generate $Ga_2O_3$ for a natural oxide layer formed on the $Al_xGa_yIn_{1-x-y}As_zP_{1-z}$ layer surface, then the $Al_xGa_yIn_{1-x-y}As_zP_{1-z}$ layer surface is dry-etched by a bromide in single atomic layer units, whereby the natural oxide layer other than the part substituted by the $Ga_2O_3$ and $Al_xGa_yIn_{1-x-y}As_zP_{1-z}$ substrate are removed.

13 Claims, 5 Drawing Sheets

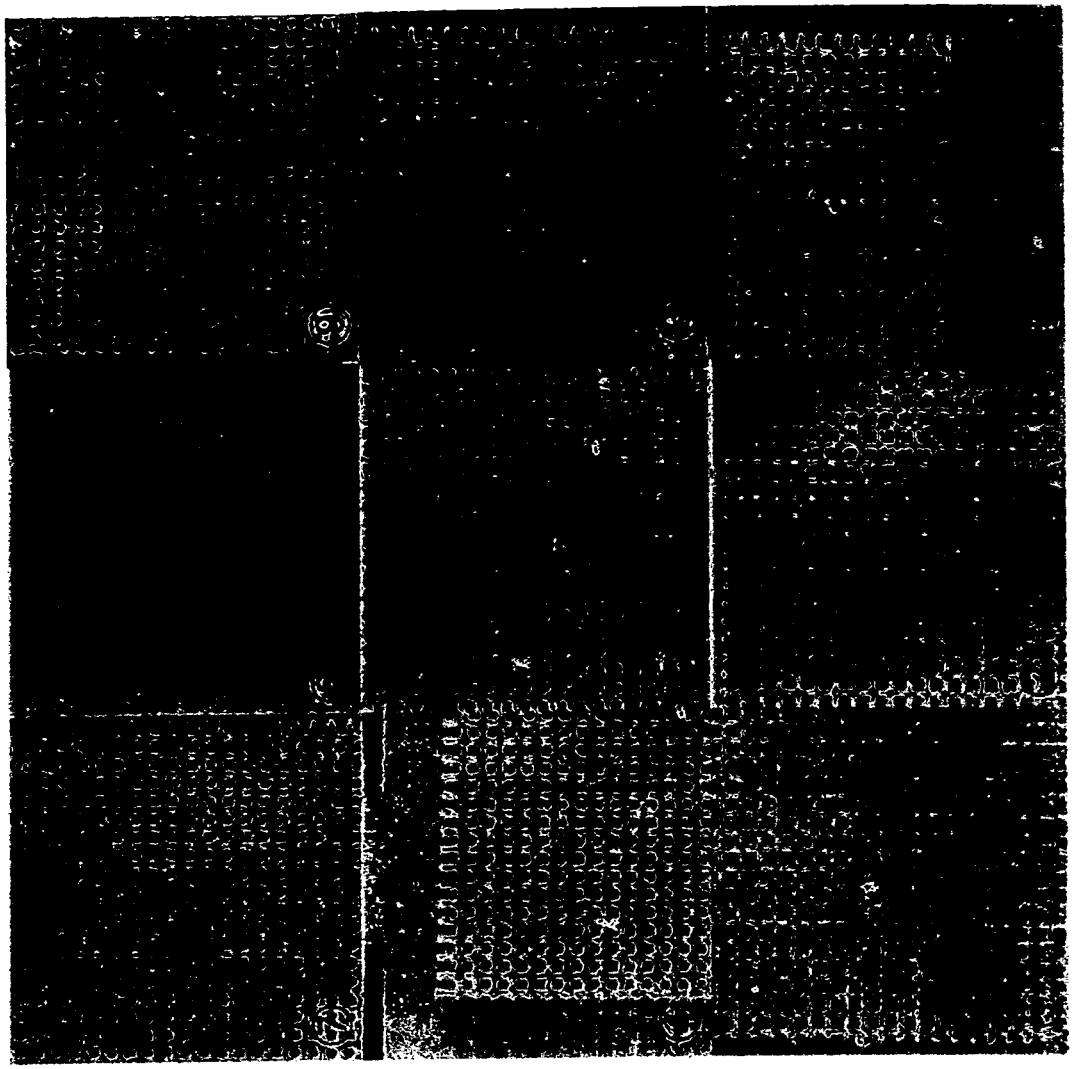
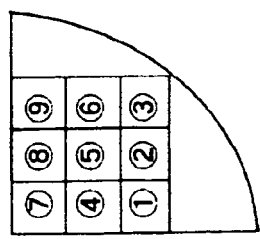
$200\mu \times 200\mu$
Fig. 2

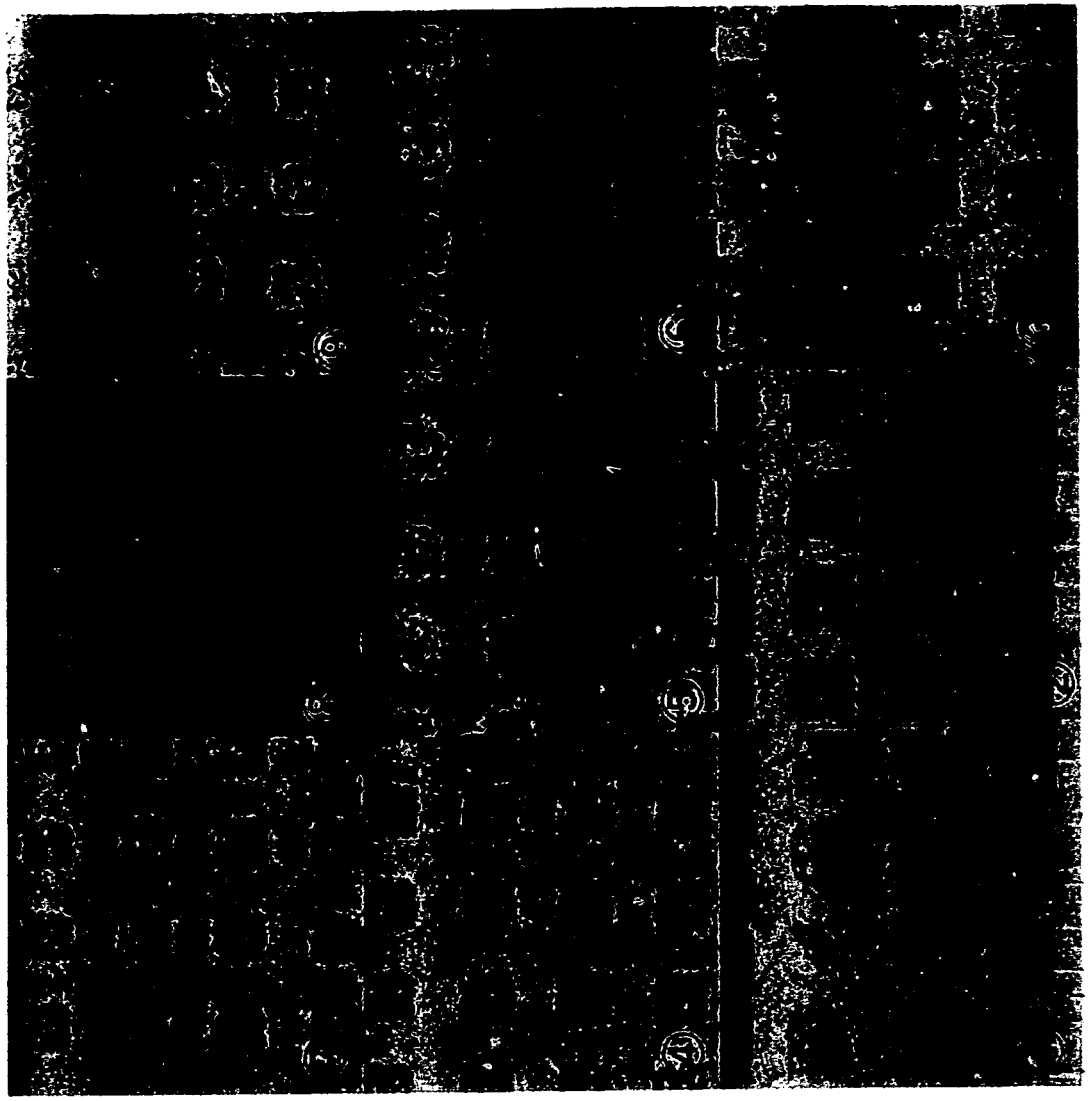
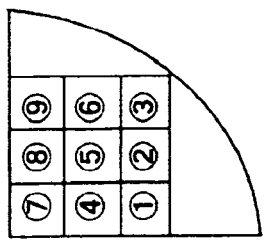
40 μ × 40 μ
| | length (nm) | width (nm) |
|---|---|---|
| ① | 3450 | 2500 |
| ② | 3000 | 2750 |
| ③ | 3700 | 3250 |
| ④ | 4100 | 4250 |
| ⑤ | 4750 | 4500 |
| ⑥ | 4000 | 3600 |
| ⑦ | 4650 | 4600 |
| ⑧ | 5200 | 5000 |
| ⑨ | 5100 | 4400 |
Fig. 3

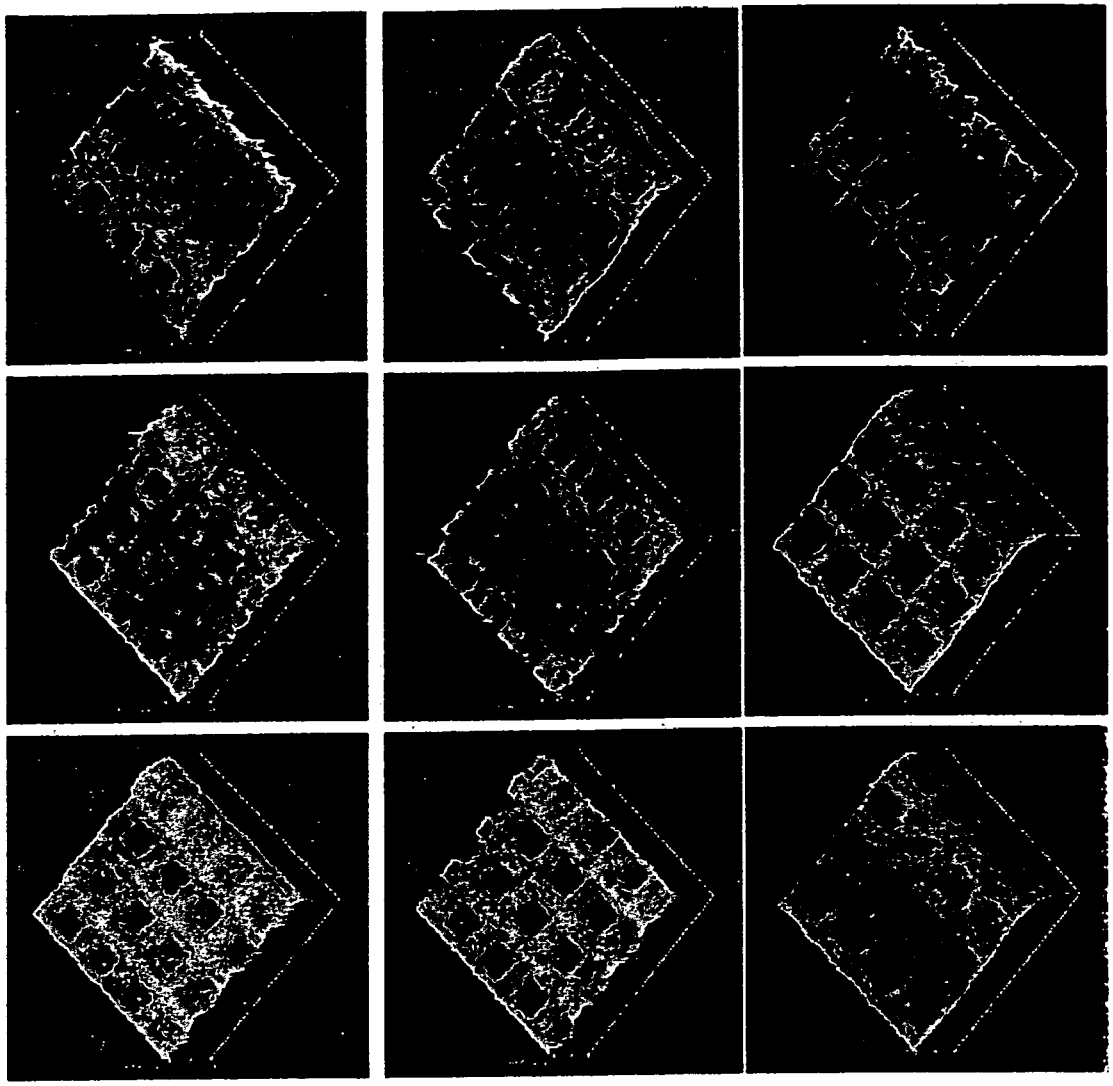
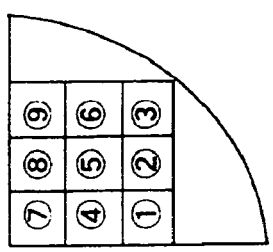
40 μ × 40 μ
Fig. 4

ELECTRON BEAM MICROPROCESSING METHOD

CROSS REFERENCE TO RELATED APPLICATION

This application is a 371 of PCT/JP04/007452, filed on May 25, 2004, and claims priority to Japanese Patent Application No. 2003-147189, filed on May 26, 2003.

TECHNICAL FIELD

The present invention relates to an electron beam micro/nano fabrication method for a compound semiconductor substrate, in particular, the surface of an $Al_xGa_yIn_{1-x-y}As_zP_{1-z}$ epitaxially grown on GaAs or an InP substrate.

BACKGROUND ART

In recent years, with the improvement in the degree of integration of ULSIs that form the core of microelectronics, circuit patterns in these quantum devices have been increasingly miniaturized. Conventionally, in fabrication processes of semiconductor devices, as basic techniques for removing unnecessary parts of insulating layers and thin metal layers with a high degree of accuracy along resist patterns, various etching methods have been widely employed. As one of these etching methods, dry etching using a halogen gas can be mentioned. This dry etching has been anticipated as being capable of fabricating a structure such as a minute quantum device since etching is carried out in a relatively clean atmosphere in a high vacuum.

For example, for Si, which is a representative device material, a dry etching process by a fluorine and chlorine-based halogen gas has been carried out. In addition, there are many reports on a dry etching process with regard to compound semiconductors such as $Al_xGa_yIn_{1-x-y}As_zP_{1-z}$ including GaAs as well, however, as a matter of fact, a technical means for enabling fabrication of a quantum element has not been completed.

For example, GaAs is a material that is great in mobility compared to Si and is capable of a higher-frequency and higher-speed operation than that of Si, and in place of Si, which has developed on an industrial scale based on advantages such as abundance in resources and crystal integrity, this has been attracting attention for its excellent properties and diversity as one of the component semiconductors to overcome limitations thereof. Moreover, as epitaxial crystal growth techniques for compound semiconductors such as this GaAs, techniques such as an MBE (molecular beam epitaxial growth) method and an MOCVD (metal-organic chemical vapor deposition) method have advanced to allow a high-quality crystal growth, therefore, importance of compound semiconductors as device materials has been increasing.

Therefore, as a dry etching method for overcoming technical limitations of a conventional dry etching method using a halogen gas for a compound semiconductor or the like, the present inventor has developed a method for dry-etching the surface of a semiconductor crystal by a bromide in single atomic layer units and has disclosed the same in Japanese Published Unexamined Patent Application No. H08-321483.

However, in order to form a circuit pattern on the surface of a GaAs layer with accuracy, it has been necessary to form a dry etching mask even when dry etching is carried out in single atomic layer units as described above.

Conventionally, fabrication of this dry etching mask has been carried out by use of an electron beam lithography technique as described in Japanese Published Unexamined Patent Application No. 2001-267213, for example.

However, with miniaturization and a greater complexity of circuit patterns of quantum devices in recent years, it has become difficult to fabricate this dry etching mask itself, therefore, a problem has existed in that reproducibility of shape and size has deteriorated, and furthermore, cost considerably has risen.

Moreover, since a surface oxide layer such as $As_2O_3$, $As_2O$, or $Ga_2O$ has been naturally formed on the surface of a GaAs layer, when forming a dry etching mask, it has also been necessary to remove this surface oxide layer.

The present invention has been made in view of the problems, and an object thereof is to provide an electron beam micro/nano fabrication method for forming on the spot, on the surface of an $Al_xGa_yIn_{1-x-y}As_zP_{1-z}$ including GaAs, a minute circuit pattern having different aspect ratios used for a quantum device without necessity for removing in advance a surface oxide layer such as $As_2O_3$, $As_2O$, or $Ga_2O$ naturally formed on the surface of a GaAs layer and also without forming a dry etching mask for forming a miniaturized complex circuit pattern.

DISCLOSURE OF THE INVENTION

An electron beam micro/nano fabrication method of the present invention is for irradiating, onto a surface of a GaAs thin layer formed on an $Al_xGa_yIn_{1-x-y}As_zP_{1-z}$ ($0 \leq x, y, z \leq 1$) surface including GaAs alone or an InP substrate, an electron beam controlled to an arbitrary electron beam diameter and current density so as to selectively substitute or generate $Ga_2O_3$ for a natural oxide layer formed on the GaAs surface, then dry-etching the GaAs layer surface by a bromide in single atomic layer units, and thereby selectively removing the natural oxide layer other than the part substituted by the $Ga_2O_3$, GaAs, and $Al_xGa_yIn_{1-x-y}As_zO_{1-z}$.

As such, for the electron beam micro/nano fabrication method of the present invention, it is unnecessary to fabricate and use a dry etching mask, which has been used at the time of dry etching, thus by changing $Ga_2O_3$ having etching resistance in crystallinity by controlling the amount of dose of an electron beam, it becomes possible to freely adjust the shape and aspect ratio of a pattern formed on the surface of $Al_xGa_yIn_{1-x-y}As_zP_{1-z}$ layer. Therefore, it becomes possible to deal with a miniaturized circuit pattern, such as a circuit pattern used for recent quantum devices.

BRIEF DESCRIPTION OF THE DRAWINGS

FIG. 2 is a view showing micrographs of the surface of a substrate observed under an AFM according to respective amounts of dose of an electron beam of an electron beam micro/nano fabrication method according to the present invention.

FIG. 3 is an enlarged view of FIG. 2 showing micrographs of the surface of a substrate observed under an AFM according to respective amounts of dose of an electron beam of an electron beam micro/nano fabrication method according to the present invention.

FIG. 4 is a perspective view of FIG. 3 showing micrographs of the surface of a substrate observed under an AFM according to respective amounts of dose of an electron beam of an electron beam micro/nano fabrication method according to the present invention.

BEST MODE FOR CARRYING OUT THE INVENTION

Figure 1:
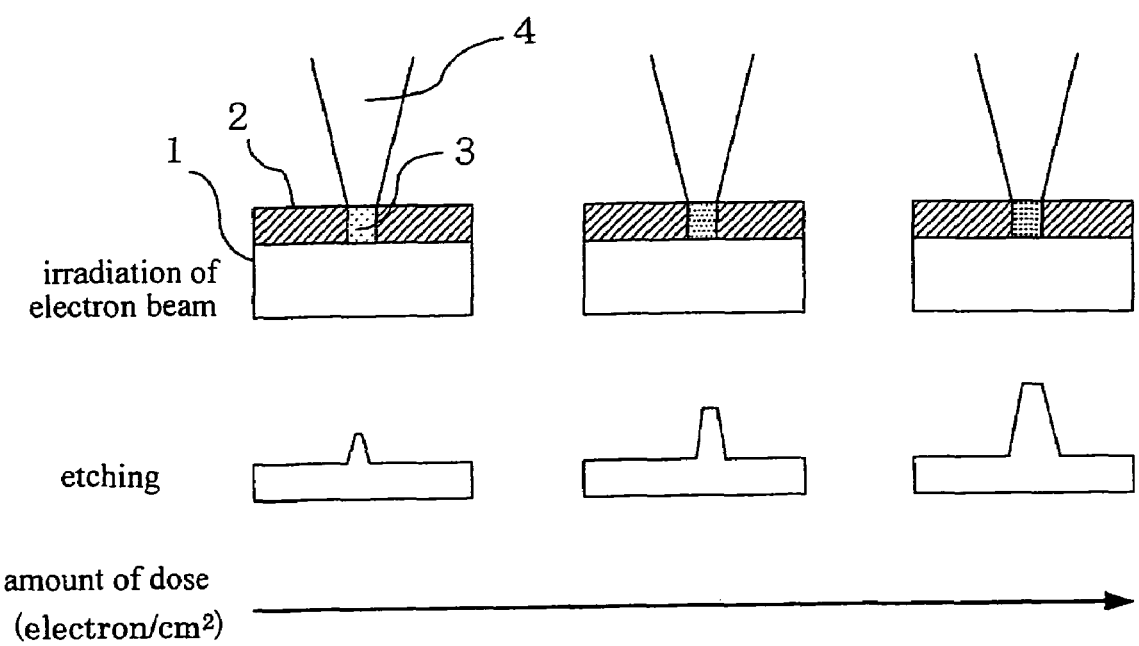
FIG. 1 is a diagram for explaining an embodiment example of an electron beam micro/nano fabrication method according to the present invention.

An electron beam micro/nano fabrication method according to an embodiment of the present invention is for irradiating, onto the surface of a GaAs thin layer formed on the surface of a $Al_xGa_yIn_{1-x-y}As_zP_{1-z}$ layer including GaAs alone or an InP substrate, an electron beam controlled to an arbitrary electron beam diameter and current density so as to selectively substitute or generate $Ga_2O_3$ for a natural oxide layer formed on the GaAs layer surface, then dry-etching the GaAs and $Al_xGa_yIn_{1-x-y}As_zP_{1-z}$ layer surface by a bromide in single atomic layer units, and thereby removing the natural oxide layer other than the part substituted by the $Ga_2O_3$, GaAs, and $Al_xGa_yIn_{1-x-y}As_zP_{1-z}$. In addition, any of $AsBr_3$, $PBr_3$, $GaBr_3$, and $InBr_3$ is used for the bromide. In addition, by controlling etching resistance at the time of dry etching by controlling the amount of irradiation (amount of dose) of the electron beam and substituting $Ga_2O_3$ different in crystallinity for the GaAs natural oxide layer, micro/nano structures having different aspect ratios can be formed by a multi-chamber vacuum identical step. In addition, it is preferable that an acceleration voltage of the electron beam is 50 keV or less and the amount of dose thereof is $10^{16}$ to $10^{20}$ electron/cm$^2$.

In addition, by an electron beam micro/nano fabrication method according to an embodiment of the present invention, onto a natural oxide layer on the surface of a GaAs thin layer formed on the surface of a $Al_xGa_yIn_{1-x-y}As_zP_{1-z}$ layer, an electron beam controlled to an arbitrary electron beam diameter and current density is directly irradiated so as to selectively substitute chemically stable $Ga_2O_3$ for the natural oxide layer such as $As_2O_3$, $As_2O$, or $Ga_2O$ naturally formed on the GaAs layer surface. Then, the other oxide such as $As_2O_3$, $As_2O$, or $Ga_2O$ is selectively thermally desorbed under a depressurized environment of approximately $10^{-3}$ Pa or less. At this time, the substituted stable oxide layer ($Ga_2O_3$) plays a role equivalent to a mask used for a conventional lithographic method, and when the $Al_xGa_yIn_{1-x-y}As_zP_{1-z}$ layer base material is etched in single atomic layer units in an atmosphere of a bromide such as $As_2Br_3$, $PBr_3$, $GaBr_3$, or $InBr_3$, $Ga_2O_3$ being a chemically stable oxide layer remains on the surface of the $Al_xGa_yIn_{1-x-y}As_zP_{1-z}$ layer, thus an arbitrary pattern can be formed on the $AlGa_yIn_{1-x-y}As_zP_{1-z}$ layer surface. Accordingly, by drawing an arbitrary pattern or the like on the $Al_xGa_yIn_{1-x-y}As_zP_{1-z}$ layer surface at the time of electron beam irradiation by use of an electron beam, chemically stable $Ga_2O_3$ is formed on a portion of the $Al_xGa_yIn_{1-x-y}As_zP_{1-z}$ layer surface irradiated with an electron beam, and this $Ga_2O_3$ remains without being etched by a bromide at the time of dry etching by a bromide, whereby it becomes possible to process an arbitrary pattern on the $Al_xGa_yIn_{1-x-y}As_zP_{1-z}$ layer.

In addition, by increasing the amount of dose of an electron beam at the time of electron beam irradiation, crystallinity of substituted $Ga_2O_3$ is improved, and mask resistance to dry etching also increases in accordance therewith, therefore, as a micro/nano structure formed after etching, one with a large aspect ratio can be formed. Namely, when the aspect ratio of a micro/nano structure formed after etching is to be increased, increasing the amount of dose of an electron beam makes it possible to control the line width and the like of a pattern on the $Al_xGa_yIn_{1-x-y}As_zP_{1-z}$ layer surface in nano-order units.

Here in after, an example of the embodiment of an ion beam micro/nano fabrication method according to this invention will be described with reference to the drawings. In FIG. 1, reference numeral 1 denotes a GaAs layer, and reference numeral 2 denotes a natural oxide layer on the surface of $As_2O_3$ or the like naturally formed on the surface of the GaAs layer 1. Also, in FIG. 1, it is shown that the amount of dose of an electron beam increases from left to right on the paper, that is, as it shifts to FIG. 1(a) to (c).

By an electron beam micro/nano fabrication method according to the present embodiment example, first, without removing the natural oxide layer 2 such as $As_2O_3$ naturally formed on the surface of the GaAs layer 1, an electron beam is irradiated in a high vacuum toward the surface of this natural oxide layer 2 at an acceleration voltage of 50 keV or less, and preferably, 20 keV or less, so that the amount of dose becomes $10^{16} \times 10^{20}$ eletron/cm$^2$. Here, the amount of dose of an electron beam is controlled by appropriately changing the amperage and irradiation time of the electron beam. By irradiating an electron beam, an oxide such as $As_2O_3$ or $As_2O_3$ of the natural oxide layer 2 is substituted by a chemically stable oxide 3 of $Ga_2O_3$. (see the upper tier of FIG. 1(a)). Next, by raising the temperature of the GaAs layer 1 where a part of the surface oxide layer 2 has been substituted by the $Ga_2O_3$ 3 to 580 to 620° C., the surface oxide layer 2 other than the part substituted by the $Ga_2O_3$ 3 is thermally desorbed, and then by carrying out dry etching in single atomic layer units by etching the surface by irradiating thereon a bromide, the part other than the part substituted by the $Ga_2O_3$ 3 is removed (see the lower tier of FIG. 1(a)). At this time, by applying patterning to the surface of the GaAs layer 1 so as to become a predetermined circuit pattern by use of an electron beam, it becomes possible to process an arbitrary pattern on the surface of the GaAs layer 1.

Here, this dry etching makes it possible to obtain a surface excellent in flatness with excellent reproducibility. Concretely, in this etching by a bromide, atoms to be etched are atoms at step positions and kink positions of the surface, and since steps and kinks that compose a surface unevenness are preferentially removed, etching can be carried out in single atomic layer units. A surface obtained as a result of such etching in single layer units is extremely high in flatness. In other words, a flat surface can be obtained at the atomic level. Furthermore, this method allows isotropic etching regardless of plane indices. Therefore, for the surfaces of a GaAs crystal, it becomes possible to control, on the spot, etching in single layer units, namely, an etching depth and a profile shape of a processing region in nano-order units on all surfaces of (100), (110), and (111) regardless of plane indices.

In this dry etching, etching can be carried out, by use of a bromide gas, in a ultra high vacuum, for example, after an evacuation to the level of $10^{-7}$ Pa, by introducing an etchant gas (bromide gas) under a under a group V molecular gas partial pressure of $10^{-3}$ to $10^{-7}$ Pa at 580 to 620° C. Here, as the bromide used as an etchant gas, preferably, $AsBr_3$, which is a compound with As and $PBr_3$, which is a compound with P, can be mentioned as representative examples thereof. As a matter of course, this may be of another type.

As such, since it is possible to etch surface atomic layers with respect to every single layer, it becomes possible to process a part other than where a natural oxide layer that is present on the surface of an $AlGa_yIn_{1-x-y}As_zP_{1-z}$ layer has been substituted by minute-sized chemically stable $Ga_2O_3$ formed by an electron beam irradiation in nano-order units, whereby micro/nano structures with high aspect ratios can be formed with excellent reproducibility and without difficulty, thus it becomes possible to carry out negative-tone lithography.

By irradiating an electron beam 4 for a time longer than that of the aforementioned case to increase the amount of dose thereof, it becomes possible to increase the aspect ratio of the $Ga_2O_3$ 3 as shown in FIGS. 1(b) and (c).

As such, by an electron beam micro/nano fabrication method according to the present invention, without removing a natural oxide layer such as $As_2O_3$ naturally formed on the surface of a GaAs layer, by irradiating an electron beam onto this natural oxide layer, it becomes possible to form a chemically stable $Ga_2O_3$ on the surface. Then, by controlling the amount of dose of an electron beam, it becomes possible to control the crystallinity of $Ga_2O_3$ formed on the surface of the GaAs layer after dry etching by a bromide, whereby structures having different aspect ratios can be formed. In addition, by drawing, at the time of electron beam irradiation, on the surface of a GaAs layer so as to become a predetermined circuit by use of an electron beam, an arbitrary circuit pattern can be processed with excellent reproducibility. Thereby, it becomes possible to apply the method to wavelength discriminating devices, micro-machining, micro/nano fabrication of photonic crystals, micro-components, and the like, quantum wires, quantum boxes, and the like, not to mention semiconductor devices.

Here, although a description has been given of a GaAs layer in the present embodiment example, effects similar to those of the GaAs layer described in the present embodiment example are provided as long as the layer is an $Al_xGa_yIn_{1-x-y}As_zP_{1-z}$ layer, therefore, the invention is not limited to a GaAs layer.

Hereinafter, the present invention will be described in grater detail based on an example.

Example

An electron beam whose electron beam diameter has been narrowed to 0.1 μm is irradiated in a vacuum toward the surface of a natural oxide layer such as $As_2O_3$ naturally formed on the surface of a GaAs layer at an acceleration voltage of 30 kV, and an amperage of $5\times10^{-7}$ A for an irradiation time of 1 to 9 gsec/dot. At this time, 1 μm-wide lines were drawn by the electron beam at intervals of 10 μm in a lattice form. In addition, by changing the irradiation time, the amount of dose was changed as follows:

$0.6\times10^{19}$ electron/cm² (1)

$1.2\times10^{19}$ electron/cm² (2)

$1.8\times10^{19}$ electron/cm² (3)

$2.4\times10^{19}$ electron/cm² (4)

$3.0\times10^{19}$ electron/cm² (5)

$3.6\times10^{19}$ electron/cm² (6)

$4.2\times10^{19}$ electron/cm² (7)

$4.8\times10^{19}$ electron/cm² (8)

$5.4\times10^{19}$ electron/cm² (9)

After irradiating an electron beam at the above respective amounts of dose, the GaAs layer was introduced in an ultra-high vacuum unit, and after an evacuation to the level of $10^{-6}$ Pa, the temperature is raised to 600° C., and after removing an oxide layer other than $Ga_2O_3$, etching was carried out for 17 minutes by introducing an $AsBr_3$ gas under a gas partial pressure of $10^{-6}$ to $10^{-5}$ Pa at 580° C.

FIG. 2 to FIG. 4 show micrographs observed under an atomic force microscope (AFM) at the respective amounts of dose. Here, the respective numbers in the drawings correspond to the aforementioned respective amounts of dose.

It can be understood from FIG. 2 through FIG. 4 that as the amount of dose of an electron beam increases, the line width of each pattern formed on the GaAs layer surface becomes wider. Consequently, by controlling the amount of dose of an electron beam, a circuit pattern having different line widths can be formed.

Figure 5:
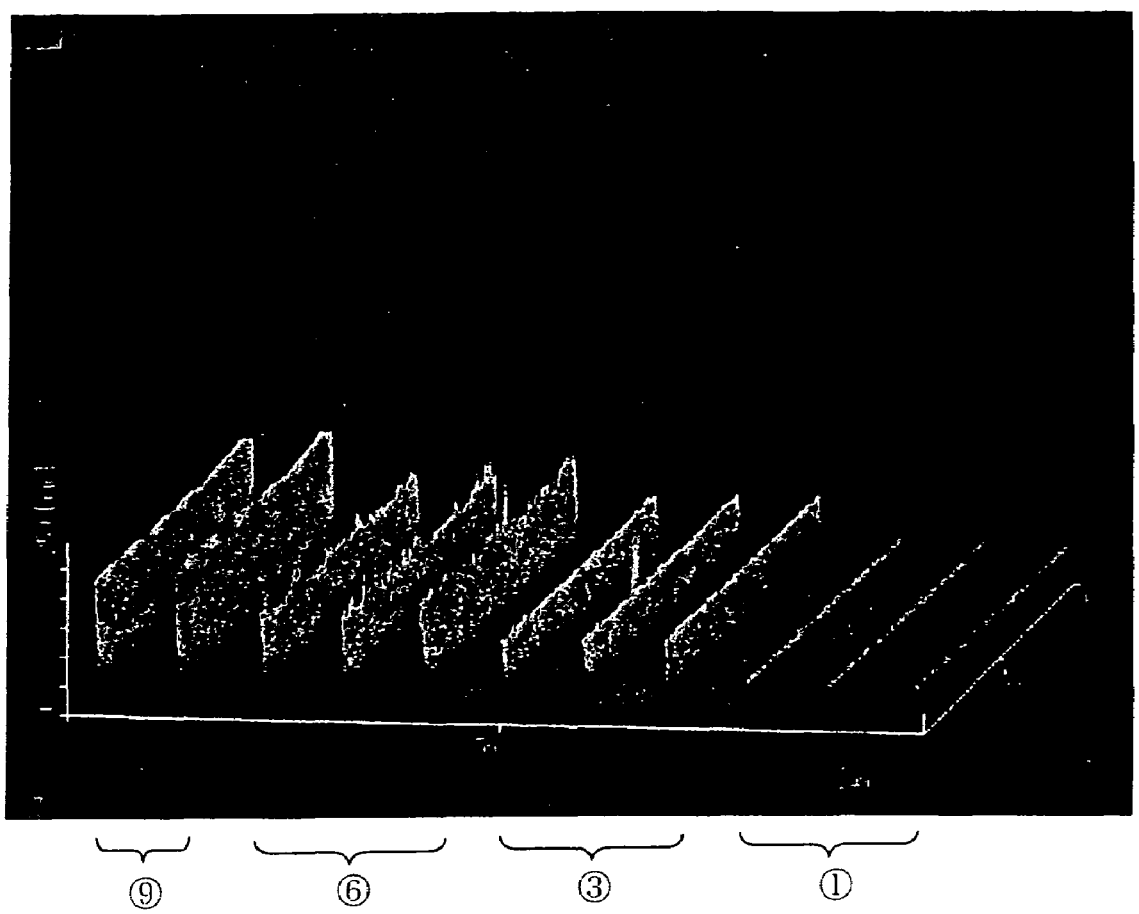
FIG. 5 is a view showing a structural micrograph under an AFM indicating a difference in aspect ratios of microstructures formed when the amounts of dose of an electron beam are different.

In addition, FIG. 5 is a view showing a structural micrograph under an AFM indicating a difference in aspect ratios of microstructures formed when the amounts of dose of an electron beam are different. As shown in FIG. 5, it can be understood from FIG. 5 that as the amount of dose of an electron beam increases, the aspect ratio becomes higher. Here, the respective numbers in the drawing correspond to the aforementioned respective amounts of dose of an electron beam.

As in the above, by doping an electron beam into a natural oxide layer formed on the surface of a GaAs layer, chemically stable $Ga_2O_3$ that is not etched by a bromide can be formed, and furthermore, by controlling the amount of dose of an electron beam, it becomes possible to control the line width and aspect ratio of a pattern formed on the GaAs layer surface and carry out processing in nano-order units through a series of steps by use of an identical device. Accordingly, it becomes possible to considerably lower the manufacturing cost.

As has been described in detail in the above, by the present invention, without removing a natural oxide layer naturally formed on the surface of a semiconductor crystal including a compound substrate such as an $Al_xGa_yIn_{1-x-y}As_zP_{1-z}$ layer, by doping an electron beam into the natural oxide layer, chemically stable $Ga_2O_3$ that is not etched by a bromide and that is high in crystallinity can be formed. Therefore, an arbitrary circuit pattern can be processed on the surface without using an etching mask at the time of etching as conventionally. Furthermore, by controlling the amount of dose of an electron beam, it becomes possible to process the line width and aspect ratio of a pattern formed on the $Al_xGa_yIn_{1-x-y}As_zP_{1-z}$ layer in nano-order units.

Moreover, the present invention is not limited to the embodiment and example as described above. Various other embodiments and examples without departing from the spirit and scope of the present invention can be made.

INDUSTRIAL APPLICABILITY

According to the present invention, it becomes possible to realize a useful element that makes the best use of various quantum device characteristics, for example, a quantum wire, a quantum box, a diffraction grating, and a micro-machine.

What is claimed is:

1. An electron beam micro/nano fabrication method for allowing negative-tone lithography for irradiating, onto a surface of a GaAs thin layer formed on an $Al_xGa_yIn_{1-x-y}As_zP_{1-z}$ ($0 \leq x, y, z \leq 1$) surface including GaAs alone or an LnP substrate, an electron beam controlled to an arbitrary electron beam diameter and current density so as to selectively substitute or generate $Ga_2O_3$ for a natural oxide layer formed on the GaAs surface, then dry-etching the GaAs layer surface by a bromide in single atomic layer units, and thereby selectively removing the natural oxide layer other than the part substituted by the $Ga_2O_3$, GaAs, and $Al_xGa_yIn_{1-x-y}As_zP_{1-z}$ wherein an acceleration voltage of the electron beam is 50 keV or less and the amount of dose thereof is $10^{16}$ to $10^{20}$ electron/cm$^2$, and microstructures having different aspect ratios can be formed by an identical step by controlling the amount of dose of an electron beam by controlling the amount to be etched at the time of dry etching by controlling the amount of irradiation of the electron beam and thereby generating Ga$_2$O$_3$ different in crystallinity on the GaAs layer surface.

2. A method for fabricating a compound semiconductor substrate, comprising:

irradiating a volume of a natural oxide layer of a GaAs thin layer present on a surface of an Al$_x$Ga$_y$In$_{1-x-y}$As$_z$P$_{1-z}$ ($0 \leq x, y, z \leq 1$) surface, which is optionally present on an InP substrate, with an electron beam having a beam diameter and a current density to form Ga$_2$O$_3$ within said volume; and contacting said natural oxide layer with an etchant comprising at least one bromide-containing gas to selectively dry-etch said natural oxide layer around said Ga$_2$O$_3$, wherein an acceleration voltage of the electron beam is at most 50 keV and an amount of dose of said electron beam is from $10^{16}$ to $10^{20}$ electron/cm$^2$.

3. The electron beam micro/nano fabrication method according to claim 1, wherein any of AsBr$_3$, PBr$_3$, GaBr$_3$, and LnBr$_3$ is used for the bromide.

4. The electron beam micro/nano fabrication method according to claim 1 or 3, wherein it is possible to control on the spot the Al$_x$Ga$_y$In$_{1-x-y}$As$_z$P$_{1-z}$ layer surface in terms of an etching depth and a profile shape of a processing region in nano-order units by controlling the amount of irradiation of the electron beam.

5. The method according to claim 2, wherein said bromide-containing gas is selected from the group consisting of As$_2$Br$_3$, PBr$_3$, GaBr$_3$, and InBr$_3$.

6. The method according to claim 2, further comprising heating said GaAs thin layer upon said irradiating and prior to said contacting to a temperature of from 580 to 620° C.

7. The method according to claim 2, wherein said dose of said electron beam is from $0.6 \times 10^{16}$ to $5.4 \times 10^{19}$ electron/cm$^2$.

8. The method according to claim 2, wherein said contacting occurs at a pressure of at least $1 \times 10^{-7}$ Pa.

9. The method according to claim 2, wherein said etchant further comprises a Group V molecular gas.

10. The method according to claim 2, wherein the natural oxide of said natural oxide layer is at least one of As$_2$O$_3$, As$_2$O, and Ga$_2$O.

11. The method according to claim 2, wherein said acceleration voltage of the electron beam is at most 20 keV.

12. The method according to claim 9, wherein said Group V molecular gas is N$_2$.

13. The method according to claim 12, wherein said etchant comprises said bromine-containing gas at a partial pressure of from $10^{-3}$ to $10^{-7}$ Pa.

* * * * *